(12) United States Patent
Sriram et al.

(10) Patent No.: US 7,943,972 B2
(45) Date of Patent: May 17, 2011

(54) METHODS OF FABRICATING TRANSISTORS HAVING BURIED P-TYPE LAYERS COUPLED TO THE GATE

(75) Inventors: Saptharishi Sriram, Cary, NC (US); Matt Willis, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/627,743

(22) Filed: Nov. 30, 2009

(65) Prior Publication Data

US 2010/0072520 A1   Mar. 25, 2010

Related U.S. Application Data

(62) Division of application No. 11/536,143, filed on Sep. 28, 2006, now Pat. No. 7,646,043.

(51) Int. Cl.
*H01L 29/812* (2006.01)
*H01L 21/338* (2006.01)

(52) U.S. Cl. ........... 257/280; 257/E29.317; 257/E21.45; 438/167

(58) Field of Classification Search .............. 257/284, 257/E29.321, 280, E29.317, E21.45; 438/167
See application file for complete search history.

(56) References Cited

U.S. PATENT DOCUMENTS

| | | | |
|---|---|---|---|
| 3,903,592 A | 9/1975 | Heckl | |
| 4,523,368 A * | 6/1985 | Feist | 438/163 |
| 4,732,871 A | 3/1988 | Buchmann et al. | |
| 4,737,469 A | 4/1988 | Stevens | |
| 4,757,028 A | 7/1988 | Kondoh et al. | |
| 4,762,806 A | 8/1988 | Suzuki et al. | |
| 4,803,526 A | 2/1989 | Terada et al. | |
| 4,897,710 A | 1/1990 | Suzuki et al. | |
| 4,947,218 A | 8/1990 | Edmond et al. | |
| 5,229,625 A | 7/1993 | Suzuki et al. | |
| 5,254,483 A | 10/1993 | Forgerson et al. | 438/167 |
| 5,264,713 A | 11/1993 | Palmour | |
| 5,270,554 A | 12/1993 | Palmour | |
| 5,289,015 A | 2/1994 | Chirovsky et al. | |
| 5,300,795 A | 4/1994 | Saunier et al. | |
| 5,306,650 A | 4/1994 | O'Mara, Jr. et al. | |
| 5,396,085 A | 3/1995 | Baliga | |

(Continued)

FOREIGN PATENT DOCUMENTS

DE   19900169 A1   7/1999

(Continued)

OTHER PUBLICATIONS

*A 10 W 2 GHz Silicon Carbide MESFET*, Microwave Journal, Sep. 1999, pp. 232, 240, 242.

(Continued)

*Primary Examiner* — Benjamin P Sandvik
*Assistant Examiner* — W. Wendy Kuo
(74) *Attorney, Agent, or Firm* — Myers Bigel Sibley & Sajovec

(57) ABSTRACT

A unit cell of a metal-semiconductor field-effect transistor (MESFET) is provided. The MESFET has a source, a drain and a gate. The gate is between the source and the drain and on an n-type conductivity channel layer. A p-type conductivity region is provided beneath the gate between the source and the drain. The p-type conductivity region is spaced apart from the n-type conductivity channel layer and electrically coupled to the gate. Related methods are also provided herein.

14 Claims, 5 Drawing Sheets

U.S. PATENT DOCUMENTS

| | | | |
|---|---|---|---|
| 5,399,883 | A | 3/1995 | Baliga |
| 5,510,630 | A | 4/1996 | Agarwal et al. |
| 5,686,737 | A | 11/1997 | Allen |
| 5,719,409 | A | 2/1998 | Singh et al. |
| 5,742,082 | A | 4/1998 | Martinez et al. |
| 5,869,856 | A | 2/1999 | Kasahara |
| 5,891,769 | A | 4/1999 | Liaw et al. |
| 5,895,939 | A | 4/1999 | Ueno |
| 5,900,648 | A | 5/1999 | Harris et al. |
| 5,925,895 | A | 7/1999 | Sriram et al. |
| 5,972,801 | A | 10/1999 | Lipkin et al. |
| 6,107,649 | A | 8/2000 | Zhao |
| 6,121,633 | A | 9/2000 | Singh et al. |
| 6,218,680 | B1 | 4/2001 | Carter, Jr. et al. |
| 6,316,793 | B1 | 11/2001 | Sheppard et al. |
| 6,686,616 | B1 | 2/2004 | Allen et al. |
| 6,956,239 | B2 | 10/2005 | Sriram |
| 2003/0017660 | A1 | 1/2003 | Li |
| 2003/0075719 | A1 | 4/2003 | Sriram |
| 2004/0099888 | A1 | 5/2004 | Sriram ......................... 257/288 |
| 2004/0233035 | A1 | 11/2004 | Fjelstad ........................ 338/260 |
| 2005/0093017 | A1 | 5/2005 | Fujikawa et al. ............. 257/162 |

FOREIGN PATENT DOCUMENTS

| | | |
|---|---|---|
| EP | 0518 683 A1 | 12/1992 |
| JP | 47-5124 | 3/1972 |
| JP | 54-155482 A | 10/1979 |
| JP | 59134874 | 8/1984 |
| JP | 60-142568 A | 7/1985 |
| JP | 60-154674 A | 8/1985 |
| JP | 60-189250 A | 9/1985 |
| JP | 63-47983 A | 2/1988 |
| JP | 64-59961 A | 3/1989 |
| JP | 1-106476 | 4/1989 |
| JP | 1-106477 | 4/1989 |
| JP | 1-196873 | 8/1989 |
| JP | 1-308876 | 12/1989 |
| JP | 2-10772 A | 1/1990 |
| JP | 4-4225534 A | 8/1992 |
| JP | 9-36359 A | 2/1997 |
| JP | 11-150124 A | 6/1999 |
| WO | WO 98/19342 A3 | 5/1998 |
| WO | WO 01/67521 A1 | 9/2001 |
| WO | WO 01/86727 A2 | 11/2001 |

OTHER PUBLICATIONS

Allen, *Silicon Carbide MESFET's with 2W/mm and 50% P.A.E. at 1.8 GHz*, 1996.

Browne, Editorial: *The Power and the Glory*, Microwaves & RF, Jul. 1999, p. 17.

Browne, *SiC MESFET Delivers 10-W Power at 2GHZ*, Microwaves & RF, Oct. 1999, pp. 138-139.

Browne, *Top Products of 1999*, Microwaves &RF, Dec. 1999, pp. 223-233.

Carter et al., *Silicon Carbide and Related Materials, 1999, Part 2*, Materials Science Forum, vols. 338-342, pp. 1247-1266 (2000).

Evwaraye et al., "Examination of Electrical and Optical Properties of Vanadium in Bulk n-Type Silicon Carbide," *J. Appl. Phys.* vol. 76, No. 10, 1994.

*First Silicon Carbide Microwave Power Products Are Introduced*, Applied Microwave & Wireless, pp. 104.

Heftman, *Wireless Semi Technology Heads Into New Territory*, Microwaves & RF, Feb. 2000, pp. 31-38.

Hilton et al., *Suppression of Instabilities in 4H-SiC Microwave MESFETs*, 2000 $8^{th}$ IEEE International Symposium.

Hilton et al., *Surface Induced Instabilities in 4H-SiC Microwave MESFETs*, Materials Science Forum, vols. 338-342, 2000, pp. 1251-1254.

Jonsson et al., *Physical Simulations on the Operations of 4H-SiC Microwave Power Transistors*, Materials Science Forum, vols. 338-342, 2000, pp. 1263-1266.

Kelner et al., *β-SiC MESFET's and Buried-Gate JFET's*, IEEE Electron Device Letters, vol. EDL-8, No. 9, Sep. 1987, pp. 428-430.

Kong et al., *Temperature Dependence of the Current-Voltage Characteristics of Metal-Semiconductor Field-Effect Transistors in n-Type β-SiC Grown Via Chemical Vapor Deposition*, Appl. Phys Lett., vol. 51, No. 6, Aug. 10, 1987, pp. 442-444.

Konstantinov et al., High Performance Silicon Carbide MESFET Utilizing Lateral Epitaxy, *Materials Science Forum*, vols. 389-393, pp. 1375-1378.

Konstantinov et al., *Investigation of Lo-Hi-Lo and Delta-Doped Silicon Carbide Structures*, Mat. Res. Soc. Symp. Proc., vol. 640, 2001, pp. H2.4.1-H2.4.6.

Ma, et al., *High Efficiency LDMOS Power FET for Low Voltage Wireless Communications*, 1996 IEEE.

Nilsson et al., *Characterization of SiC MESFETs on Conducting Substrates*, Materials Science Forum, vols. 338-342, 2000, pp. 1255-1258.

Noblanc et al., *Power Density Comparison Between Microwave Power MESFET's Processed on Conductive and Semi-Insulating Wafer*, Materials Science Forum, vols. 338-342, 2000, pp. 1247-1250.

Palmour et al., *Characterization of Device Parameters in High-Temperature Metal-Oxide-Semiconductor Field Effect Transistors in β-SiC Thin Films*, J. Appl. Phys, vol. 64, No. 4, Aug. 15, 1988, pp. 2168-2177.

Palmour et al., *High-Temperature Depletion-Mode Metal-Oxide-Semiconductor Field Effect Transistors in Beta-SiC Thin Films*, Appl. Phys. Lett., vol. 51, No. 24, Dec. 14, 1987, pp. 2028-2030.

Palmour et al., *Ultrafast Silicon-Carbide Rectifiers*, Powertechnics Magazine, Aug. 1989, pp. 18-21.

Rorsman et al., *Fabrication, Characterization and Modeling of SiC MESFETs*, Materials Science Forum, vols. 338-342, 2000, pp. 12-59-1262.

*SiC MESFET Drives PCS Base Stations*, Wireless Systems Design, Oct. 1999, pp. 24.

Soares, ed., *GaAs MESFET Circuit Design*, Artech House, 1988, pp. 7-9, 17-18.

Sze, *Physics of Semiconductor Devices, Second Edition*, John Wiley & Sons, 1981, pp. 341-347.

Yokogawa et al., *Electronic Properties of Nitrogen Delta-Doped Silicon Carbide Layers*, Mat. Res. Soc. Symp. Proc., vol. 640, 2001, pp. H2.5.1-H2.5.6.

\* cited by examiner

METHODS OF FABRICATING TRANSISTORS HAVING BURIED P-TYPE LAYERS COUPLED TO THE GATE

CLAIM OF PRIORITY

The present application is a divisional of U.S. application Ser. No. 11/536,143, filed Sep. 28, 2006, now U.S. Pat. No. 7,646,043 the content of which is hereby incorporated herein by reference in its entirety.

STATEMENT OF GOVERNMENT INTEREST

The present invention was made, at least in part, with support from the Department of the Navy, contract number N00014-02-C-0250. The Government may have certain rights in this invention.

FIELD OF THE INVENTION

The present invention relates to microelectronic devices and more particularly to transistors, for example, metal-semiconductor field-effect transistors (MESFETs).

BACKGROUND OF THE INVENTION

Electrical circuits requiring high power handling capability (>20 watts) while operating at high frequencies such as radio frequencies (500 MHz), S-band (3 GHz) and X-band (10 GHz) have become commonplace. Because of the increase in high power, high frequency circuits there has been a corresponding increase in demand for transistors that are capable of reliably operating at radio frequencies and above while still being capable of handling higher power loads. Metal-semiconductor field effect transistors (MESFETs) have been developed for high frequency applications. The MESFET construction may be preferable for high frequency applications because only majority carriers carry current. The MESFET design may be preferred over other designs because the reduced gate capacitance may permit faster switching times of the gate input. Therefore, although generally all field-effect transistors utilize only majority carriers to carry current, the Schottky gate structure of the MESFET may make the MESFET more desirable for high frequency applications.

Silicon carbide (SiC) has been known for many years to have excellent physical and electronic properties which should theoretically allow production of electronic devices that can operate at higher temperatures, higher power and higher frequency than devices produced from silicon (Si) or GaAs. The high electric breakdown field of about $4 \times 10^6$ V/cm, high saturated electron drift velocity of about $2.0 \times 10^7$ cm/sec and high thermal conductivity of about 4.9 W/cm-° K indicate that SiC would be suitable for high frequency, high power applications.

SiC MESFETs fabricated on high resistivity substrates have found widespread use for high power RF amplifiers. Devices having highly doped p-type layers under the source region of the FET have been provided and have been successful in providing high breakdown voltages for power amplifiers, while reducing drifts in device characteristics arising from trapping in semi-insulating substrates. These devices are discussed, for example, in commonly assigned U.S. Pat. No. 6,956,239 to Sriram.

SUMMARY OF THE INVENTION

Embodiments of the present invention provide a unit cell of a metal-semiconductor field-effect transistor (MESFET). The MESFET has a source, a drain and a gate. The gate is between the source and the drain and on an n-type conductivity channel layer. A p-type conductivity region is provided beneath the gate between the source and the drain. The p-type conductivity region is spaced apart from the n-type conductivity channel layer and electrically coupled to the gate.

In some embodiments of the present invention, the p-type conductivity region electrically coupled to the gate may provide a second gate and the thickness of the n-type conductivity channel layer may be from about 0.1 to about 0.5 µm. The MESFET may function as switch and the larger thickness of the n-type conductivity channel layer may reduce an on-resistance of the switch.

In still further embodiments of the present invention, the n-type conductivity channel layer and the substrate may define a mesa having sidewalls that define a periphery of the MESFET. Portions of the p-type conductivity region and the gate may extend past the mesa. The p-type conductivity region and the gate may be electrically coupled at the portions of the p-type conductivity region and the gate that extend past the mesa. A metal contact may be provided on the portions of the p-type conductivity region and the gate that extend past the mesa such that the metal contact electrically couples the p-type conductivity region and the gate. The metal contact may include, for example, titanium and/or gold.

In some embodiments of the present invention, the source may have a first sidewall and a second sidewall. The first sidewall of the source may be remote from the gate and the second sidewall of the source may be adjacent the gate. Similarly, the drain may have a first sidewall and a second sidewall. The first sidewall of the drain may be adjacent the gate and the second sidewall of the drain may be remote from the gate. The p-type conductivity region may extend from the second sidewall of the source to the first sidewall of the drain without extending past the second sidewall of the source and the first sidewall of the drain.

In some embodiments of the present invention, the source may have a first sidewall and a second sidewall. The first sidewall of the source may be remote from the gate and the second sidewall of the source may be adjacent the gate. Similarly, the drain may have a first sidewall and a second sidewall. The first sidewall of the drain may be adjacent the gate and the second sidewall of the drain may be remote from the gate. The p-type conductivity region may extend from the second sidewall of the source to the first sidewall of the drain.

In further embodiments of the present invention, a silicon carbide (SiC) substrate may be provided. The p-type conductivity region may be disposed on the SiC substrate. The n-type conductivity channel layer may be n-type conductivity SiC and the p-type conductivity region may be p-type conductivity SiC.

In still further embodiments of the present invention, a silicon carbide (SiC) substrate may be provided and at least a portion of the p-type conductivity region may be disposed in the SiC substrate. The p-type conductivity region may extend about 0.5 µm into the SiC substrate. The p-type conductivity region may have a carrier concentration of from about $1.0 \times 10^{18}$ cm$^{-3}$ to about $1.0 \times 10^{20}$ cm$^{-3}$.

In some embodiments of the present invention, a buffer layer may be provided on the SiC substrate and the p-type conductivity region may be formed in the buffer layer. The buffer layer may have a thickness of about 2.0 µm. The p-type conductivity region may extend about 0.5 µm into the buffer layer.

In further embodiments of the present invention, an n-type conductivity gallium arsenide (GaAs) substrate may be provided. The p-type conductivity region may be provided on the GaAs substrate. The n-type conductivity channel layer may include n-type conductivity GaAs and the p-type conductivity region may include p-type conductivity GaAs. In certain embodiments of the present invention, the gate may extend into the n-type conductivity channel layer.

Still further embodiments of the present invention provide a unit cell of a MESFET. A MESFET is provided having a source, a drain and a gate. The gate is between the source and the drain. A p-type conductivity region is provided beneath the gate between the source and the drain. The p-type conductivity region is electrically coupled to the gate.

Some embodiments of the present invention provide a MESFET configured to function as a switch. The MESFET includes a source, a drain and a gate. The gate is between the source and the drain on an n-type conductivity channel layer having a thickness of from about 0.1 to about 0.5 µm. A p-type conductivity region is provided beneath the gate between the source and the drain. The p-type conductivity region provides a second gate.

While the present invention is described above primarily with reference to MESFETs, other types of transistors as well as methods of fabricating transistors and, in particular, MESFETs are also provided.

DETAILED DESCRIPTION OF THE INVENTION

Figure 1:
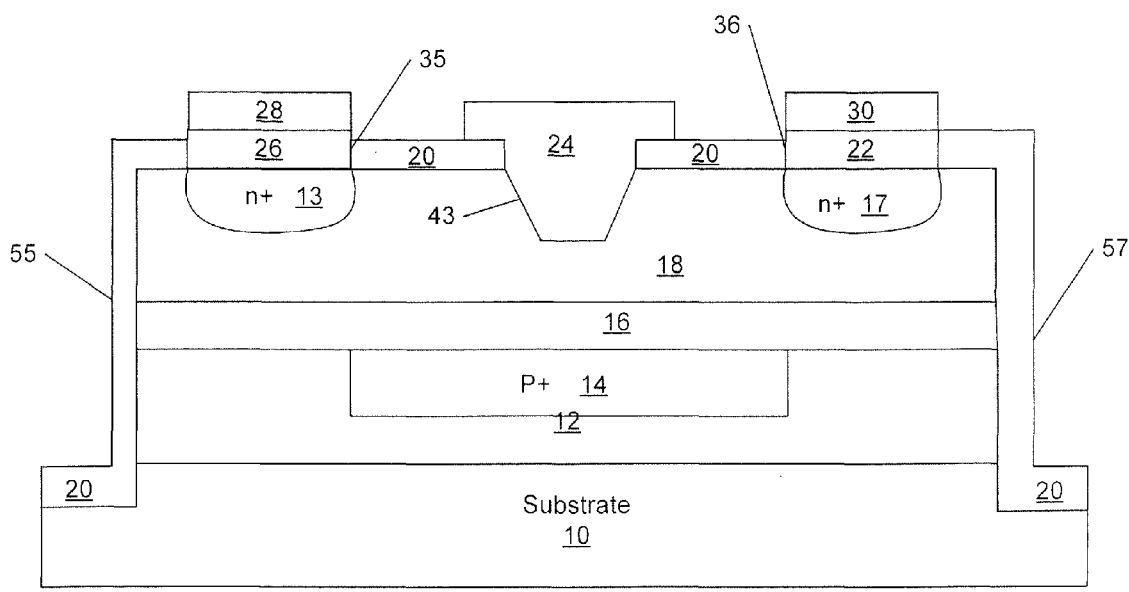
FIG. 1 is a cross-sectional view of a transistor according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on" another element or layer, it can be directly on the other element or layer or intervening elements or layers may be present. In contrast, when an element is referred to as being "directly on" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention. Optional elements of the cross-sections are illustrated by dotted lines in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present specification and will not be interpreted in an idealized or overly formal sense unless expressly so defined herein.

As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies) and currents.

Embodiments of the present invention will now be described in detail below with reference to FIGS. 1 through 3 that illustrate various embodiments of the present invention and various processes of fabricating embodiments of the present invention. In particular, transistors having buried p-type layers beneath the source region of transistors for power amplifiers have obtained high breakdown voltages and exhibited reduced drifts in device characteristics due to trapping in semi-insulting substrates. Transistors having buried p-type layers beneath the source region are discussed in detail in commonly assigned U.S. Pat. No. 6,956,239 to Sriram entitled Transistors Having Buried P-Type Layers Beneath the Source Region, the disclosure of which is hereby incorporated herein by reference as if set forth in its entirety.

As discussed herein, use of buried p-type layers may also be useful in transistors for radio frequency (RF) switch applications, however, the buried p-type layer cannot be connected to the source as discussed in U.S. Pat. No. 6,956,239 since the forward bias conduction between the p-layer and the drain may cause a loss of input-output isolation when the RF switch is in the OFF state. Thus, according to some embodiments of the present invention, transistors, for example, metal-semiconductor field effect transistors (MESFETs), are provided having p-type conductivity regions beneath the gate of the MESFET between the source and the drain. The p-type conductivity region is electrically coupled to the gate as will be discussed further below. The presence of this p-type conductivity region, for example, p-type conductivity silicon carbide (SiC), may allow the p-type conductivity region to provide a second gate, the presence of which may allow the use of a thicker channel layer. The thicker channel layer may reduce the on-resistance of the RF switch. Furthermore, the reduced on-resistance may be obtained according to some embodiments of the present invention without significantly increasing the input-output capacitance. Therefore, according to some embodiments of the present invention, the on-resistance, off-capacitance product may be reduced, which is beneficial for RF switches.

Figure 2A:
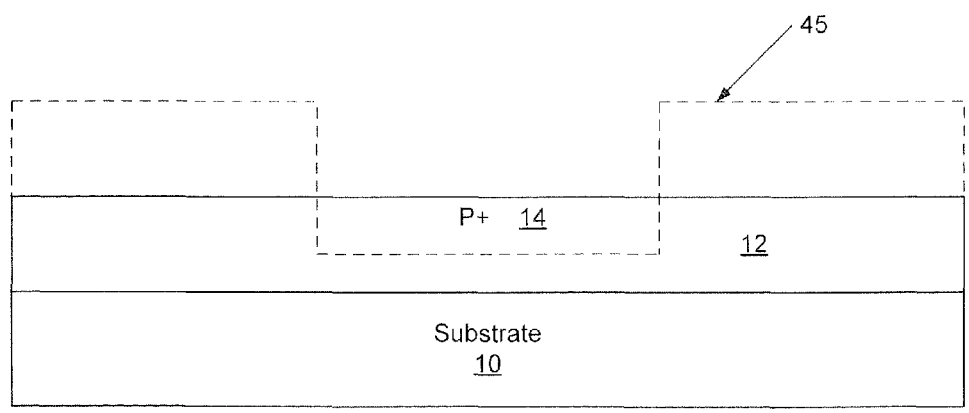
FIGS. 2A through 2G illustrate processing steps in the fabrication of transistors according to some embodiments of the present invention.
Figure 2B:
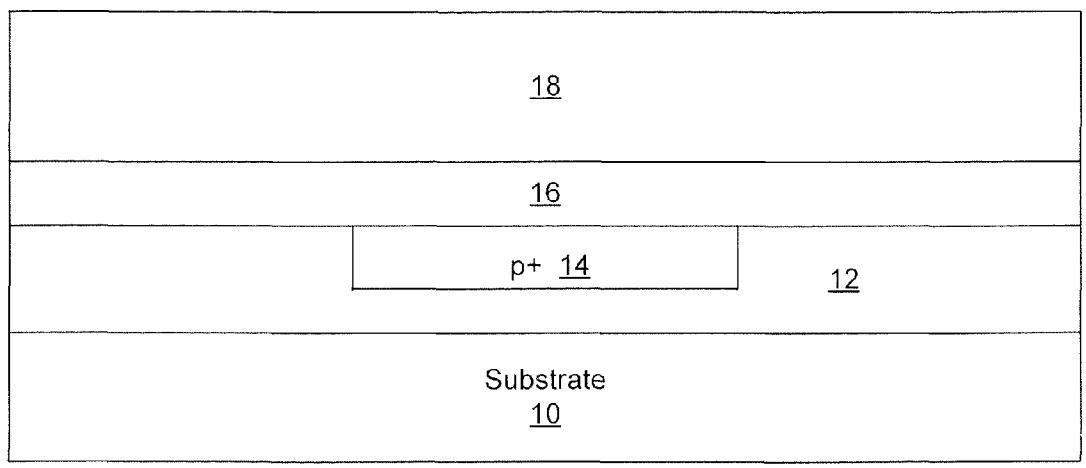

Referring to FIG. 1, transistors, for example, metal-semiconductor field effect transistors (MESFETs), according to some embodiments of the present invention will now be described in detail. As seen in FIG. 1, a substrate 10 is provided. The substrate 10 may be a single crystal bulk silicon carbide (SiC) substrate of either p-type or n-type conductivity or semi-insulating. The substrate 10 of either p-type or n-type may be very lightly doped. The substrate may be formed of silicon carbide selected from the group of 6H, 4H, 15R or 3C silicon carbide. Although the present invention is described herein with reference to a SiC substrate, the present invention should not be limited to SiC. For example, in some embodiments, the substrate 10 may also include, for example, gallium arsenide (GaAs).

An optional buffer layer 12 of, for example, p-type silicon carbide may be provided on the substrate 10. The buffer layer 12 may include p-type conductivity silicon carbide of 6H, 4H, 15R or 3C polytype. The buffer layer 12 may, for example, have a carrier concentration of from about $0.5 \times 10^{15}$ cm$^{-3}$ to about $3.0 \times 10^{15}$ cm$^{-3}$. Suitable dopants include aluminum, boron and/or gallium. The buffer layer 12 may have a thickness of about 2.0 µm. Although the buffer layer 12 is described above as p-type silicon carbide, the invention should not be limited to this configuration. Alternatively, the buffer layer 12 may be undoped silicon carbide (i.e. not intentionally doped) or very low-doped n-type conductivity silicon carbide. If a very low doped n-type silicon carbide is utilized for the buffer layer 12, the carrier concentration of the buffer layer 12 is preferably less than about $5.0 \times 10^{14}$ cm$^{-3}$.

As further illustrated in FIG. 1, a p$^+$ region 14 is provided beneath a gate of the device. As used herein, "p$^+$" or "n$^+$" refer to regions that are defined by higher carrier concentrations than are present in adjacent or other regions of the same or another layer or substrate. In some embodiments of the present invention, the p$^+$ region 14 may extend from a sidewall 35 of a source region 13 or source contact 26 to a sidewall 36 of a drain region 17 and/or drain contact 22 without extending to beneath the source or drain regions 13, 17 or contacts 26, 22.

The p$^+$ region 14 is a region of p-type conductivity, for example, p-type conductivity silicon carbide. For the p$^+$ region 14, carrier concentrations of from about $1.0 \times 10^{18}$ cm$^{-3}$ about $1.0 \times 10^{20}$ cm$^{-3}$ may be suitable, but carrier concentrations as high as possible are preferred. The carrier concentration may not be constant throughout the p$^+$ region 14, and may be as high as possible at the surface of the p$^+$ region 14 to facilitate the formation of ohmic contacts thereon. In some embodiments of the present invention, the p$^+$ region 14 may be provided in the buffer layer 12 as illustrated in FIG. 1. However, in some embodiments of the present invention, the p$^+$ region 14 may be provided in the substrate 10. The p$^+$ region 14 may, for example, extend about 0.5 µm into the buffer layer 12 or the substrate 10.

The p region 14 is electrically coupled to the gate 24 as will be discussed further below. The presence of the p$^+$ region 14 electrically coupled to and beneath the gate 24 may allow the p-type conductivity region 14 to provide a second gate, the presence of which may allow the use of a thicker channel layer 18 (discussed below). The thicker channel layer may reduce the on-resistance of the RF switch. Furthermore, the reduced on-resistance may be obtained according to some embodiments of the present invention without significantly increasing the input-output capacitance of the device. Therefore, according to some embodiments of the present invention, the on-resistance, off-capacitance product may be reduced, which is beneficial for RF switches.

The buffer layer 12 may be disposed between the substrate 10 and a second buffer layer 16. The second buffer layer 16 may be, for example, p-type silicon carbide having a carrier concentration of from about $1.0 \times 10^{15}$ cm$^{-3}$ to about $5.0 \times 10^{15}$ cm$^{-3}$, but typically about $2.0 \times 10^{15}$ cm$^{-3}$. The p-type silicon carbide buffer layer 16 may also have a thickness of from about 0.5 µm to about 1.0 µm. Although the second buffer layer 16 is described above as being of p-type conductivity silicon carbide, it will be understood that the present invention is not limited to this configuration. Alternatively, for example, the second buffer layer 16 may be of n-type conductivity, for example, very lightly doped n-type conductivity SiC or undoped SiC as discussed above with respect to buffer layer 12. In some embodiments of the present invention, the second buffer layer 16 may be provided directly on the substrate 10.

An n-type conductivity channel layer 18 is provided on the second buffer layer 16 as illustrated in FIG. 1. The n-type conductivity channel layer 18 may be formed of n-type conductivity silicon carbide of 6H, 4H, 15R or 3C polytype. The n-type conductivity channel layer may include one or more layers of, for example, n-type conductivity silicon carbide having different carrier concentrations. The n-type conductivity channel layer 18 may have a thickness of from about 0.1 to about 0.5 µm. As discussed above, the n-type conductivity channel layer may be made thicker due to the presence of the p$^+$ region 14, which can be used as a second gate. The thicker channel layer may reduce the on-resistance of the RF switch according to some embodiments of the present invention.

As illustrated in FIG. 1, the substrate 10, the buffer layer 12, the p$^+$ region 14, the second buffer layer 16 and the n-type conductivity channel layer 18 may be etched to form an isolation mesa. The mesa has sidewalls 55, 57 defined by the substrate 10, the buffer layer 12, the p+ region 14, the second buffer layer 16 and the n-type conductivity channel layer 18 that define the periphery of the transistor.

As discussed above, according to some embodiments of the present invention, the p+ region 14 is electrically coupled to the gate 24. Thus, according to some embodiments of the present invention, portions of the p+ region 14 and the gate contact 24 may extend beyond the mesa and a metal contact 56 may be provided on the exposed portions of the p+ region 14 and the gate 24 that extend beyond the mesa so as to electrically couple the p+ region 14 to the gate 24 as illustrated in FIG. 3 as will be discussed below with respect to FIG. 3.

As further illustrated in FIG. 1, n+ regions 13 and 17 are provided in the source and drain regions of the device, respectively. Regions 13 and 17 are typically of n-type conductivity silicon carbide and have carrier concentrations that are greater than the carrier concentration of the n-type conductivity channel layer 18. For the n+ regions 13 and 17, carrier concentrations of about $1 \times 10^{19}$ cm$^{-3}$ may be suitable, but carrier concentrations as high as possible are preferred.

Ohmic contacts 26 and 22 are provided on the implanted regions 13 and 17, respectively, and are spaced apart so as to provide the source contact 26 and the drain contact 22. The ohmic contacts 25 and 22 are preferably formed of nickel or other suitable metals. Although not illustrated in the cross section of FIG. 1, the metal contact 56 (FIG. 3) discussed above may be provided on the exposed portions of the gate 24 and the p+ region 14 that extend beyond the mesa.

As illustrated in FIG. 1, the gate contact 24 may be provided in the recess 43 between the source region 13 and the drain region 17. It will be understood that although the gate contact 24 is illustrated in FIG. 1 as being provided in a single recess 43, embodiments of the present invention are not limited to this configuration. For example, the gate contact 24 may be disposed on the n-type conductivity channel layer 18 and may not be provided in a recess or may be provided in a double recess structure without departing from the scope of the present invention.

The gate contact 24 may be formed of chromium, platinum, platinum silicide, nickel, and/or TiWN, however, other metals such as gold, known to one skilled in the art to achieve the Schottky effect, may be used. The Schottky gate contact 24 typically has a three layer structure. Such a structure may have advantages because of the high adhesion of chromium (Cr). For example, the gate contact 24 can optionally include a first gate layer of chromium (Cr) contacting the n-type conductivity channel layer 18. The gate contact 24 may further include an overlayer (not shown) of platinum (Pt) and gold 32 or other highly conductive metal. Alternatively, the gate contact 24 may include a first layer of nickel in the recess 43 on the n-type conductivity channel layer 18. The gate contact 24 may further include an overlayer (not shown) on the first layer of nickel that includes a layer of gold.

As further illustrated in FIG. 1, metal overlayers 28 and 30 may be provided on the source contact 26 and the drain contact 22, respectively. The overlayers 28 and 30 may be, for example, gold, silver, aluminum, platinum and/or copper. Other suitable highly conductive metals may also be used for the overlayer.

Referring now to the cross sections of FIGS. 2A through 2G, processing steps in the fabrication of FETs according to some embodiments of the present invention will be discussed. As illustrated in FIG. 2A, an optional buffer layer 12 may be grown or deposited on a substrate 10. The substrate 10 may be a semi-insulating SiC substrate, a p-type substrate or an n-type substrate. The substrate 10 may be very lightly doped.

The buffer layer 12 may be of p-type conductivity silicon carbide having a carrier concentration of about $3.0 \times 10^{15}$ cm$^{-3}$ or less, but typically $1.0 \times 10^{15}$ cm$^{-3}$ or less. Alternatively, the buffer layer 12 may be n-type silicon carbide or undoped silicon carbide.

As further illustrated in FIG. 2A, a mask 45 may be formed for implanting the p+ region 14. The p+ region 14 is typically formed by ion implantation of, for example, aluminum, boron and/or gallium, followed by a high temperature anneal. Suitable anneal temperatures may be from about 1300 to about 1600° C., typically about 1500° C. The ion implantation may be performed on the regions that are not covered by the mask 45 to form p+ region 14 as illustrated in FIG. 2B. Thus, the ions are implanted in portions of the buffer layer 12, if present, or the substrate 10, to provide a highly doped region of p-type conductivity, for example, p-type conductivity silicon carbide. Once implanted, the dopants are annealed to activate the implant. The highly doped region of p-type conductivity may extend about 0.5 μm into the buffer layer 12 or the substrate 10.

As illustrated in FIG. 2B, a second buffer layer 16 and an n-type conductivity channel layer 18 are grown or deposited on the buffer layer 12. It will be understood that if the buffer layer 12 is not included, the second buffer layer 16 and the n-type conductivity channel layer 18 may be grown or deposited on the substrate 10. The second buffer layer 16 is formed on the buffer layer 12 and the n-type conductivity channel layer 18 is formed on the second buffer layer 16 as illustrated in FIG. 2B. The channel layer 18 may have a thickness of from about 0.1 to about 0.5 μm.

Figure 2C:
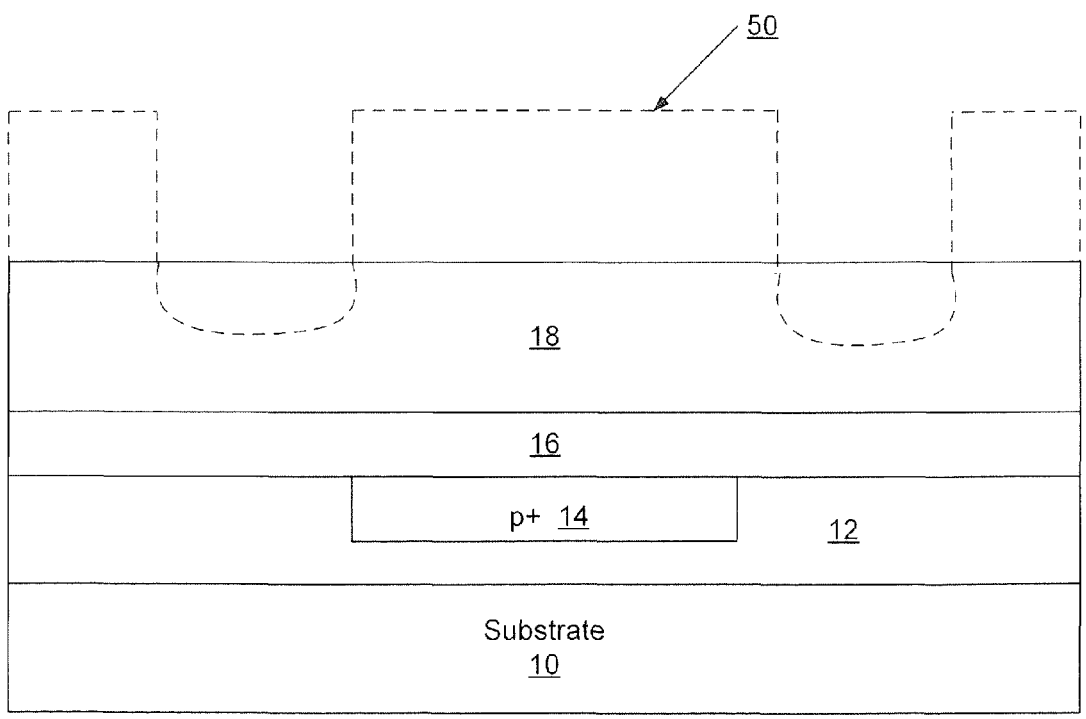
Figure 3:
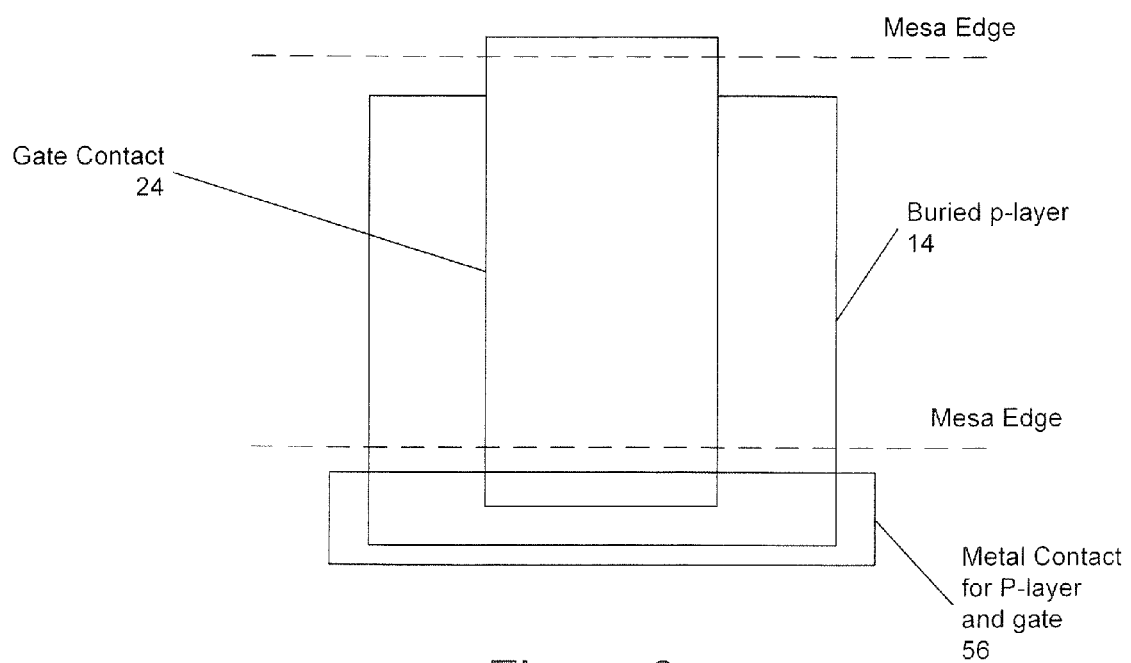
FIG. 3 is a top view of transistors illustrating an electrical coupling of the gate and p-type conductivity region according to some embodiments of the present invention.

As illustrated in FIG. 2C, a mask 50 may be formed for implanting n+ regions 13 and 17. Regions 13 and 17 are typically formed by ion implantation of, for example, nitrogen (N) or phosphorus (P), followed by a high temperature anneal. Suitable anneal temperatures may be from about 1100 to about 1600° C. The ion implantation may be performed on the regions which are not covered by the mask 50 to form n+ regions 13 and 17 as illustrated in FIG. 2C. Thus, the ions are implanted in portions of the n-type conductivity channel layer 18 to provide highly doped regions of n-type conductivity, for example, n-type conductivity SiC, having higher carrier concentrations than the n-type conductivity channel layer 18. Once implanted, the dopants are annealed to activate the implant.

Figure 2D:
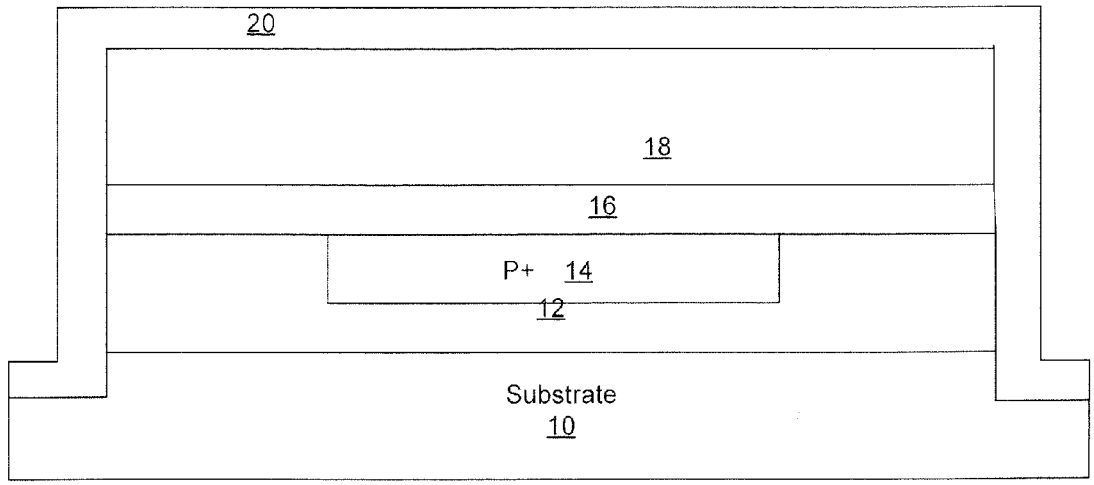

As seen in FIG. 2D, the substrate 10, the buffer layer 12, the p+ region 14, the second buffer layer 16 and the n-type conductivity channel layer 18 may be etched to form an isolation mesa. The mesa has sidewalls 55, 57 defined by the substrate 10, the buffer layer 12, the p+ region 14, the second buffer layer 16 and the n-type conductivity channel layer 18 that define the periphery of the transistor. The mesa may be formed to extend into the substrate 10 of the device as shown in FIG. 2D. The mesa may be formed by reactive ion etching the above described device, however, other methods known to one skilled in the art may be used to form the mesa.

As discussed above, according to some embodiments of the present invention, the p+ region 14 is electrically coupled to the gate 24. Thus, according to some embodiments of the present invention, portions of the p+ region 14 and the gate contact 24 may extend beyond the mesa and a metal contact 56 may be provided on the exposed portions of the p+ region 14 and the gate 24 that extend beyond the mesa so as to electrically couple the p+ region 14 to the gate 24 as illustrated in FIG. 3. FIG. 3 illustrates a top view of devices according to some embodiments of the present invention. The metal contact 56 may include, for example, nickel or other suitable metals. It will be understood that the p+ region and the gate 24 may be connected using other methods known to those having skill in the art without departing from the scope of the present invention.

FIG. 2D further illustrates the formation of an insulator layer 20, for example, an oxide layer. The insulator layer 20 may be grown or deposited over the exposed surface of the existing structure, i.e. on the isolation mesa, n⁺ regions 13 and 17 and the n-type conductivity channel layer 18. The oxidation process may remove, for example, SiC that may have been damaged by the etch process and may also smooth out roughness that may have been created on the surface by the etch.

Figure 2E:
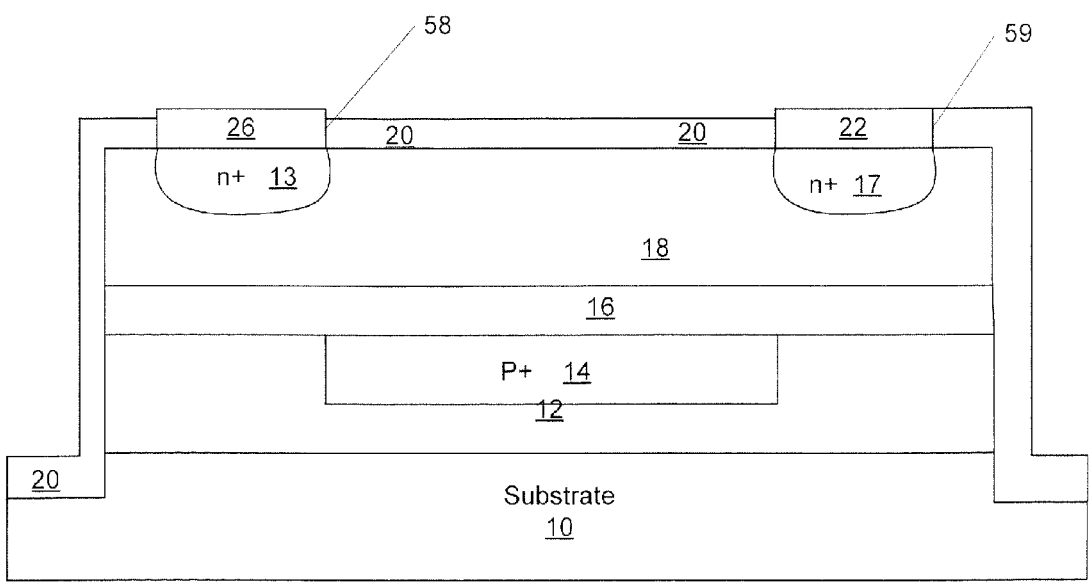

FIG. 2E illustrates the formation of contact windows 58 and 59 for the source and drain regions, respectively. In particular, contact windows 58 and 59 may be etched through the insulator layer 20 to the n⁺ regions 13 and 17, respectively. As further illustrated in FIG. 2E, nickel may then be evaporated to deposit the source and drain contacts 26 and 22 in the contact windows 58 and 59, respectively. The nickel may be annealed to form the ohmic contacts 26 and 22. Such a deposition and annealing process may be carried out utilizing conventional techniques known to those of skill in the art. For example, the ohmic contacts 26 and 22 may be annealed at a temperature of from about 950° C. to about 1100° C. for about 2 minutes. However, other times and temperatures may also be utilized. Times from about 30 seconds to about 10 minutes may be, for example, acceptable.

Figure 2F:
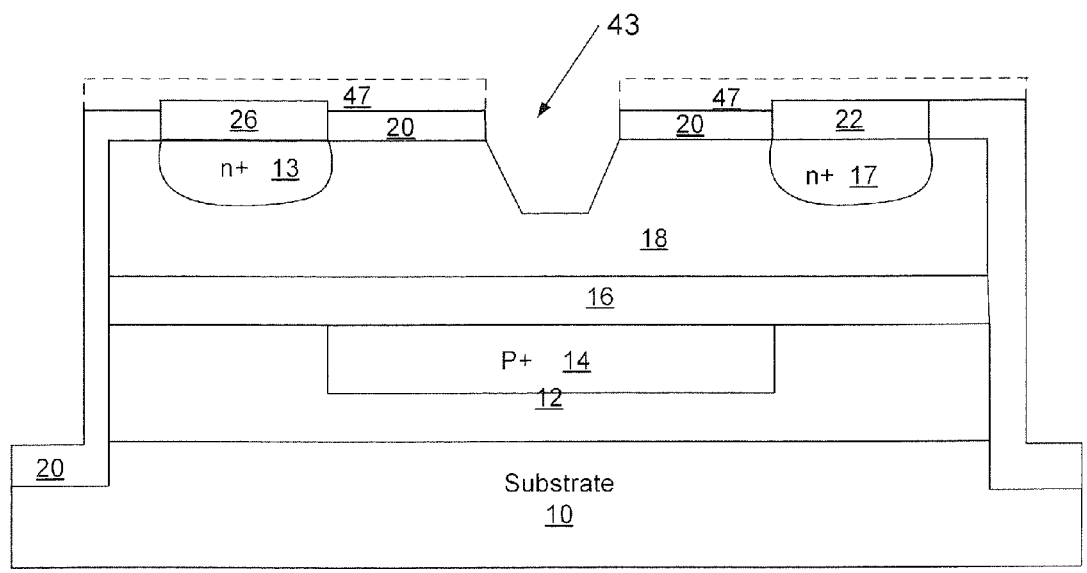

FIG. 2F illustrates the formation of a recess 43 of the MESFET. The recess 43 may be formed by forming a mask 47 and then etching through the insulator layer 20 and the n-type conductivity channel layer 18 to form the recess 43 according to the mask 47. The recess 43 may be formed by an etching process, such as a dry or wet etch process. For example, the recess 43 may be formed by dry etching, for example, Electron Cyclotron Resonance (ECR) or Inductively Coupled Plasma (ICP) etching. The mask 47 may be removed.

Figure 2G:
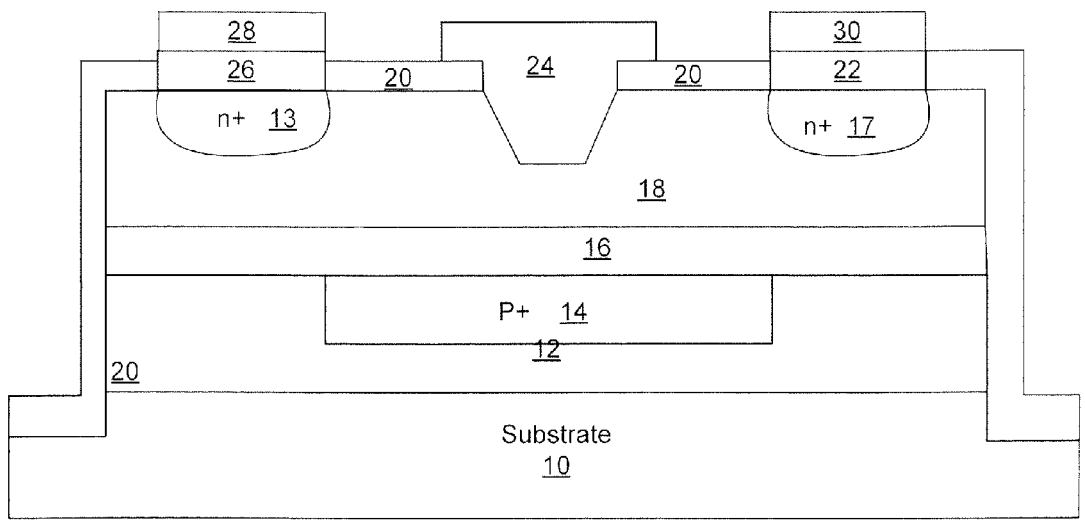

Referring now to FIG. 2G, the gate contact 24 and the overlayers 28 and 30 may be formed. For example, a window may be opened in the insulator 20 and a layer of chromium may be deposited in the recess 43. Typically, the chromium layer is formed by evaporative deposition. The gate structure may then be completed by deposition of platinum and gold. As will also be appreciated by those of skill in the art, the overlayers 28 and 30 may be formed either before or after formation of the gate structure. Accordingly, the overlayers 28 and 30 may be formed prior to the formation of a gate contact or after the formation of a gate contact.

Furthermore, although not illustrated in Figures, the metal contact 56 (FIG. 3) that electrically couples the p⁺ region and the gate 24 may be formed at the same time as the other contacts discussed above.

As is briefly described above, transistors according to embodiments of the present invention include a p-type conductivity region beneath the gate between the source and the drain. The presence of this p-type conductivity region may provide, for example, a second gate (p-type conductivity region), which may allow the thickness of the channel layer to be increased. The thicker channel layer may reduce the on-resistance of the RF switch. Furthermore, the reduced on-resistance may be obtained according to some embodiments of the present invention without significantly increasing the input-output capacitance. Therefore, according to some embodiments of the present invention, the on-resistance, off-capacitance product may be reduced, which is beneficial for RF switches.

Although the present invention is described above with reference to SiC MESFETs, the present invention is not limited to SiC MESFETs. For example, MESFETs according to embodiments of the present invention may be, for example, gallium arsenide (GaAs) MESFETs. In particular, if the present invention were described with respect to GaAs MESFETs, the p-type conductivity regions might be p-type conductivity GaAs regions, the n-type conductivity channel layers might be n-type conductivity GaAs layers and the like.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A unit cell of a metal-semiconductor field-effect transistor (MESFET), comprising:
   a MESFET having a source, a drain and a gate, the gate being between the source and the drain; and
   a p-type conductivity region beneath the gate between the source and the drain, the p-type conductivity region being electrically coupled to the gate, wherein portions of the p-type conductivity region and the gate extend past a mesa defining a periphery of the MESFET; and
   wherein the p-type conductivity region and the gate are electrically coupled at the portions of the p-type conductivity region and the gate that extend past the mesa.

2. The MESFET of claim 1, further comprising an n-type conductivity channel layer, wherein the gate is provided on the n-type conductivity channel layer, wherein the p-type conductivity region electrically coupled to the gate comprises a second gate and wherein the n-type conductivity channel layer has a thickness of from about 0.1 to about 0.5 µml.

3. The MESFET of claim 2, wherein the MESFET comprises a switch and wherein the n-type conductivity channel layer having the thickness reduces an on-resistance of the switch.

4. The MESFET of claim 1:
   wherein an n-type conductivity channel layer and a substrate define the mesa, the mesa having sidewalls that define the periphery of the MESFET.

5. The MESFET of claim 4, further comprising a metal contact on the portions of the p-type conductivity region and the gate that extend past the mesa such that the metal contact electrically couples the p-type conductivity region and the gate.

6. A metal semiconductor field effect transistor (MESFET) configured to function as a switch, the MESFET comprising:
   a source, a drain and a gate, the gate being between the source and the drain on an n-type conductivity channel layer having a thickness of from about 0.1 to about 0.5 µm; and
   a p-type conductivity region beneath the gate between the source and the drain, the p-type conductivity region comprising a second gate,
   wherein portions of the p-type conductivity region and the gate extend past a mesa defining a periphery of the MESFET; and
   wherein the p-type conductivity region and the gate are electrically coupled at the portions of the p-type conductivity region and the gate that extend past the mesa.

7. A method of forming a metal-semiconductor field-effect transistor (MESFET), the method comprising:
   forming a MESFET having a source, a drain and a gate, the gate being between the source and the drain; and
   forming a p-type conductivity region beneath the gate between the source and the drain, the p-type conductivity region being electrically coupled to the gate, wherein portions of the p-type conductivity region and the gate extend past a mesa defining a periphery of the MESFET; and wherein the p-type conductivity region and the gate are electrically coupled at the portions of the p-type conductivity region and the gate that extend past the mesa.

8. A method of forming a metal-semiconductor field-effect transistor (MESFET) configured to function as a switch, the method comprising:

forming a source, a drain and a gate, the gate being between the source and the drain on an n-type conductivity channel layer having a thickness of from about 0.1 to about 0.5 µm; and forming a p-type conductivity region beneath the gate between the source and the drain, the p-type conductivity region comprising a second gate, wherein portions of the p-type conductivity region and the gate extend past a mesa defining a periphery of the MESFET; and wherein the p-type conductivity region and the gate are electrically coupled at the portions of the p-type conductivity region and the gate that extend past the mesa.

9. The MESFET of claim 1, wherein the MESFET comprises a silicon carbide MESFET.

10. The MESFET of claim 1, wherein the gate is provided on an n-type conductivity channel layer, the MESFET further comprising:

a p-type buffer layer spaced apart from and beneath the n-type conductivity channel layer, wherein the p-type conductivity region is provided in the p-type buffer layer.

11. The MESFET of claim 10, wherein the p-type buffer layer comprises a first p-type buffer layer, the MESFET further comprising a second p-type buffer layer between the n-type conductivity channel layer and the first p-type buffer layer.

12. The MESFET of claim 6, wherein the MESFET comprises a silicon carbide MESFET.

13. The MESFET of claim 6, wherein the gate is provided on an n-type conductivity channel layer, the MESFET further comprising:

a p-type buffer layer spaced apart from and beneath the n-type conductivity channel layer, wherein the p-type conductivity region is provided in the p-type buffer layer.

14. The MESFET of claim 13, wherein the p-type buffer layer comprises a first p-type buffer layer, the MESFET further comprising a second p-type buffer layer between the n-type conductivity channel layer and the first p-type buffer layer.

* * * * *

UNITED STATES PATENT AND TRADEMARK OFFICE
CERTIFICATE OF CORRECTION

| | | |
|---|---|---|
| PATENT NO. | : 7,943,972 B2 | Page 1 of 1 |
| APPLICATION NO. | : 12/627743 | |
| DATED | : May 17, 2011 | |
| INVENTOR(S) | : Sriram et al. | |

It is certified that error appears in the above-identified patent and that said Letters Patent is hereby corrected as shown below:

Column 6, Line 23: Please correct "The p region" to read -- The $p^+$ region --

Column 10, Claim 2, Line 32: Please correct "0.5 μml." to read -- 0.5 μm. --

Signed and Sealed this
First Day of November, 2011

David J. Kappos
*Director of the United States Patent and Trademark Office*